United States Patent
Cho et al.

(10) Patent No.: US 9,087,152 B2
(45) Date of Patent: Jul. 21, 2015

(54) VERIFICATION SUPPORTING APPARATUS AND VERIFICATION SUPPORTING METHOD OF RECONFIGURABLE PROCESSOR

(71) Applicant: SAMSUNG ELECTRONICS CO., LTD., Suwon-si (KR)

(72) Inventors: Young-Chul Cho, Yongin-si (KR); Tai-Song Jin, Seoul (KR); Dong-Kwan Suh, Hwaseong-si (KR); Yen-Jo Han, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 13/772,647

(22) Filed: Feb. 21, 2013

(65) Prior Publication Data
US 2013/0246856 A1    Sep. 19, 2013

(30) Foreign Application Priority Data
Mar. 16, 2012    (KR) .................. 10-2012-0027401

(51) Int. Cl.
| | | |
|---|---|---|
| *G06F 9/45* | (2006.01) | |
| *G06F 11/36* | (2006.01) | |
| *G06F 17/50* | (2006.01) | |

(52) U.S. Cl.
CPC .......... *G06F 11/3604* (2013.01); *G06F 8/4452* (2013.01); *G06F 17/5027* (2013.01); *G06F 11/3664* (2013.01)

(58) Field of Classification Search
CPC ............ G06F 11/3604; G06F 11/5027; G06F 11/3664; G06F 8/4452
See application file for complete search history.

(56) References Cited

U.S. PATENT DOCUMENTS

| | | | |
|---|---|---|---|
| 6,289,443 B1 * | 9/2001 | Scales et al. ................. | 712/241 |
| 6,754,893 B2 * | 6/2004 | Granston et al. ............ | 717/161 |
| 6,820,250 B2 * | 11/2004 | Muthukumar et al. ....... | 717/116 |
| 7,607,116 B2 | 10/2009 | Kwon | |
| 7,673,294 B2 * | 3/2010 | Granston et al. ............ | 717/149 |
| 8,191,057 B2 * | 5/2012 | Archambault et al. ....... | 717/161 |
| 8,418,157 B2 * | 4/2013 | Ogawa et al. ................. | 717/151 |
| 2002/0152455 A1 | 10/2002 | Hundt et al. | |
| 2003/0154469 A1 * | 8/2003 | Anderson et al. ............ | 717/161 |
| 2003/0191986 A1 * | 10/2003 | Cyran et al. .................... | 714/32 |
| 2003/0225560 A1 * | 12/2003 | Garcia et al. .................. | 703/17 |
| 2005/0177775 A1 * | 8/2005 | Qadeer et al. .................. | 714/38 |
| 2008/0005730 A1 | 1/2008 | Inamdar | |

(Continued)

FOREIGN PATENT DOCUMENTS

| | | |
|---|---|---|
| KR | 10-2008-0062980 | 7/2008 |
| WO | WO 00/43886 | 7/2000 |

OTHER PUBLICATIONS

Pietrzak et al., A practical type analysis for verification of modular prolog programs, Jan. 2008, 10 pages.*

(Continued)

*Primary Examiner* — Thuy Dao
(74) *Attorney, Agent, or Firm* — NSIP Law

(57) ABSTRACT

A verification supporting apparatus and a verification supporting method of a reconfigurable processor is provided. The verification supporting apparatus includes an invalid operation determiner configured to detect an invalid operation from a result of scheduling on a source code, and a masking hint generator configured to generate a masking hint for the detected invalid operation.

14 Claims, 5 Drawing Sheets

(56) References Cited

U.S. PATENT DOCUMENTS

| | | | |
|---|---|---|---|
| 2008/0209407 A1* | 8/2008 | Okabayashi et al. | 717/146 |
| 2009/0293026 A1* | 11/2009 | Tsuchiya | 716/5 |
| 2012/0185675 A1* | 7/2012 | Kim et al. | 712/216 |
| 2014/0007061 A1* | 1/2014 | Perkins et al. | 717/150 |

OTHER PUBLICATIONS

Fellahi et al., Code-size conscious pipelining of imperfectly nested loops, Sep. 2007, 7 pages.*

Bhattacharyya et al., Automatic speculative parallelization of loops using polyhedral dependence analysis, Feb. 2013, 9 pages.*

\* cited by examiner

FIG. 3

```
      .
      .
      .
31.      //#RPCC  CGA
32.      for (i=0 ;  i<N ;  i++)  {
34.         result +=  i*10 ;
35.         A[i]  = result ;
36.      }
      .
      .
      .
```

```
<mask_info name = "workplace/cga/sched_info/main_cga_1.info">
  <prologue>
    <masked cycle="0" fu_id="1"/>
    <masked cycle="0" fu_id="5"/>
    <masked cycle="1" fu_id="0"/>
    <masked cycle="1" fu_id="4"/>
    <masked cycle="1" fu_id="9"/>
    <masked cycle="2" fu_id="0"/>
    <masked cycle="5" fu_id="0"/>
    <masked cycle="5" fu_id="4"/>
    <masked cycle="6" fu_id="0"/>
  </prologue>
  <epilogue_start sched_cycle="3" fu_id="2"/>
  <epilogue>
    <masked cycle="1" fu_id="1"/>
    <masked cycle="1" fu_id="5"/>
    <masked cycle="2" fu_id="9"/>
    <masked cycle="4" fu_id="2"/>
    <masked cycle="4" fu_id="3"/>
  </epilogue>
</mask_info>
```

VERIFICATION SUPPORTING APPARATUS AND VERIFICATION SUPPORTING METHOD OF RECONFIGURABLE PROCESSOR

CROSS-REFERENCE TO RELATED APPLICATIONS

This application claims the benefit under 35 U.S.C. §119 (a) of a Korean Patent Application No. 10-2012-0027401, filed on Mar. 16, 2012, the entire disclosure of which is incorporated herein by reference for all purposes.

BACKGROUND

1. Field

The following description relates to a verification supporting apparatus and a verification supporting method of a reconfigurable processor.

2. Description of Related Art

A Coarse-Grained Array (CGA)-based reconfigurable processor has a complicated structure that includes function units (FUs), a global register file, a local register file, and other components that would be known to one of ordinary skill in the art. Thus, detecting locations and time points at which a CGA executes erroneous computation is a difficult and lengthy process.

An error verification apparatus has been developed to find locations and time points at which a CGA has executed erroneous computation that is incorrect. The CGA-based reconfigurable processor is based on modulo-scheduling such that the prologue, body, and epilogue of a loop have the same configuration. Accordingly, invalid operations (that is, operations having a negative influence on the results of computation) may be executed in the prologue and epilogue of the loop. However, due to execution of the invalid operations, the error verification apparatus may output verification results that are erroneous.

SUMMARY

In one general aspect, there is provided a verification supporting apparatus of a reconfigurable processor, the apparatus including an invalid operation determiner configured to detect an invalid operation from a result of scheduling on a source code, and a masking hint generator configured to generate a masking hint for the detected invalid operation.

The verification supporting apparatus may further include that the reconfigurable processor includes a Coarse-Grained Array (CGA)-based processor.

The verification supporting apparatus may further include that the detected invalid operation includes one of operations mapped to a prologue or epilogue of a loop according to modulo-scheduling of a compiler.

The verification supporting apparatus may further include that the masking hint includes information about a number of a cycle in the prologue or epilogue of the loop in which the detected invalid operation exists and an identification (ID) of a function unit (FU) to which the detected invalid operation is mapped.

The verification supporting apparatus may further include that the detected invalid operation is not executed in a function simulator while being executed in a Register Transfer Level (RTL) simulator.

The verification supporting apparatus may further include that masking information is generated based on the masking hint to prevent a verification apparatus of the reconfigurable processor from comparing simulation results related to the detected invalid operation among simulation results of the function simulator and the RTL simulator.

In another general aspect, there is provided a verification supporting method of a reconfigurable processor, the method including detecting an invalid operation from a result of scheduling on a source code, and generating a masking hint for the detected invalid operation.

The verification supporting method may further include that the reconfigurable processor includes a Coarse-Grained Array (CGA)-based processor.

The verification supporting method may further include that the detected invalid operation comprises one of operations mapped to a prologue or epilogue of a loop according to modulo-scheduling of a compiler.

The verification supporting method may further include that the masking hint includes information about a number of a cycle in the prologue or epilogue of the loop in which the detected invalid operation exists and an identification (ID) of a function unit (FU) to which the detected invalid operation is mapped.

The verification supporting method may further include that the detected invalid operation is not executed in a function simulator while being executed in a Register Transfer Level (RTL) simulator.

The verification supporting method may further include generating masking information based on the masking hint to prevent a verification apparatus of the reconfigurable processor from comparing simulation results related to the detected invalid operation among simulation results of the function simulator and the RTL simulator.

In yet another general aspect, a reconfigurable processor includes a verification supporting apparatus including an invalid operation determiner and a masking hint generator, the invalid operation determiner being configured to detect an invalid operation from a result of scheduling on a source code, the masking hint generator being configured to generate a masking hint for the detected invalid operation, and a verification apparatus configured to compare simulation results of a function simulator to simulation results of a Register Transfer Level to determine if an error has been generated, and generate masking information based on the masking hint to prevent comparison of simulation results related to the detected invalid operation among the simulation results of the function simulator.

The reconfigurable processor may further include that the detected invalid operation includes one of operations mapped to a prologue or epilogue of a loop according to modulo-scheduling of a compiler.

The reconfigurable processor may further include that the masking hint includes information about a number of a cycle in the prologue or epilogue of the loop in which the detected invalid operation exists and an identification (ID) of a function unit (FU) to which the detected invalid operation is mapped.

The reconfigurable processor may further include that the detected invalid operation is executed in the function simulator.

The reconfigurable processor may further include that the masking information includes a masking bit configured to indicate whether the comparing of the simulation results of the function simulator to the simulation results of the RTL simulator is to be executed.

Other features and aspects will be apparent from the following detailed description, the drawings, and the claims.

BRIEF DESCRIPTION OF THE DRAWINGS

FIG. 3 is a diagram illustrating an example of code written in C language, which is to be mapped to a Coarse-Grained Array (CGA).

FIG. 5 is a diagram illustrating an example of a masking hint based on the scheduling result of FIG. 4.

Figure 1:
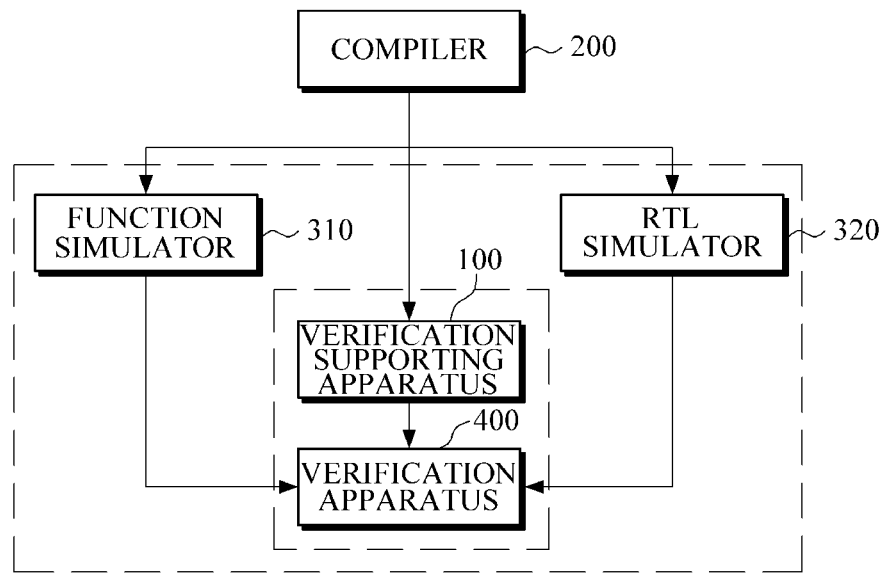
FIG. 1 is a diagram illustrating an example of configuration of a verification environment for a reconfigurable processor.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. In addition, descriptions of well-known functions and constructions may be omitted for increased clarity and conciseness.

FIG. 1 is a diagram illustrating an example of configuration of a verification environment for a reconfigurable processor. Referring to the example illustrated in FIG. 1, a verification apparatus 400 detects a time point and a location at which an error has been generated based on a comparison of a simulation result of a function simulator 310 to a simulation result of a Register Transfer Level (RTL) simulator 320. That is, the verification apparatus 400 receives the simulation result from the function simulator 310 and the simulation result from the RTL simulator 320 and compares the received simulation results. Then, the verification apparatus 400 determines, if the simulation result of the function simulator 310 mismatches that of the RTL simulator 320, that an error has been generated, and detects a time point and a location at which the error has been generated.

In an example, the verification apparatus 400 is an apparatus configured to verify a Program Counter (PC) and instructions in a Very Long Instruction Word (VLIW) mode or src/dst operands of Function Units (FUs) in a Coarse Grained Array (CGA) mode.

The function simulator 310 receives scheduling information from a compiler 200, simulates an operation corresponding to a target machine, such as, for example, a FU of a processor core, and generates a trace representing the simulated operation.

In the CGA mode, the prologue, body, and epilogue of a loop generated through modulo-scheduling by the compiler 200 use the same configuration information. As a result, in an example, invalid operations that are mapped to the prologue or epilogue based on modulo-scheduling are executed by the RTL simulator 320. That is, since the invalid operations, which are substantially not executed in the function simulator 310, are simulated in the RTL simulator 320, the simulation results of the function simulator 310 and the RTL simulator 320 do not match. The verification apparatus 400 detects such invalid operations as errors. As a result, a method has been introduced of designing the function simulator 310 to a RTL simulator level such that the function simulator 310 executes invalid operations to make the simulation results of the simulators 310 and 320 identical. However, the method may lessen the simulation speed of the function simulator 310 and require a design of the function simulator 310 to be changed.

For this reason, according to the current example, a verification supporting apparatus 100 is provided to support the verification apparatus 400. In an example, the verification supporting apparatus 100 supports a verification apparatus (for example, 400 of FIG. 1) of a reconfigurable processor, such as a CGA-based processor or any other reconfigurable process known to one of ordinary skill in the art. In an example, the verification supporting apparatus 100 is configured as software to support the verification apparatus 400. Meanwhile, according to other examples, the verification supporting apparatus 100 is configured as a software module included in the verification apparatus 400, or as a module included in the compiler 200 that compiles and schedules source codes.

Figure 2:
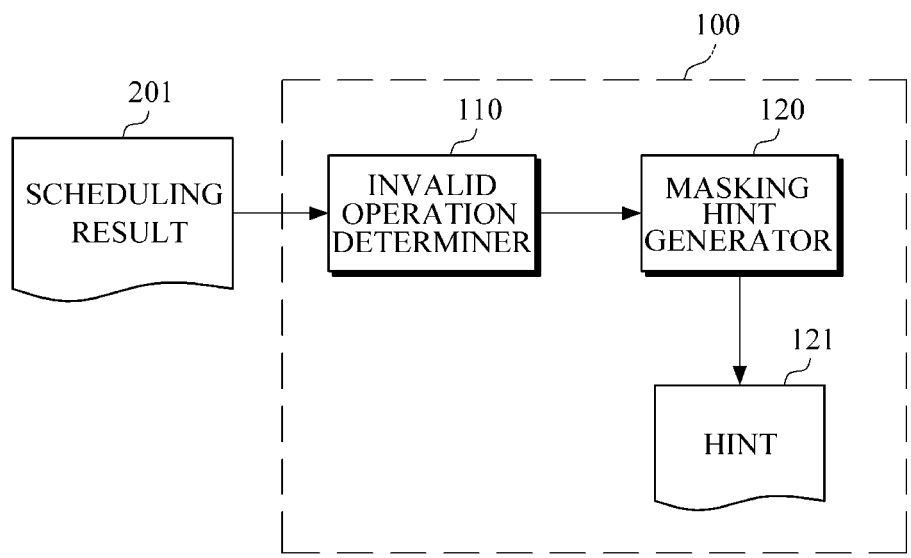
FIG. 2 is a diagram illustrating an example of a verification supporting apparatus.

FIG. 2 is diagram illustrating an example of a verification supporting apparatus 100. Referring to the example illustrated in FIG. 2, the verification supporting apparatus 100 includes an invalid operation determiner 110 and a masking hint generator 120.

The invalid operation determiner 110 detects an invalid operation from result 201 of scheduling by the compiler 200. For example, the invalid operation determiner 110 receives the scheduling result 201 from the compiler 200, stores the scheduling result 201 in memory, and reads the scheduling result 201 from the memory. The invalid operation determiner 110 is then configured to detect an invalid operation that is not actually executed, among operations mapped to the prologues and epilogues of loops, for each cycle.

The masking hint generator 120 generates a masking hint 121 for an invalid operation detected by the invalid operation determiner 110. In a further example, the masking hint 121 is generated in the form of a file, table, or another arbitrary format. In yet another example, the masking hint 121 includes information about a number of the cycle in which the invalid operation exists in the prologue or epilogue and identifications (IDs) of FUs to which the invalid operation is mapped. The masking hint 121 is input to the verification apparatus 400 and, in an example, provides the verification apparatus 400 with a hint to generate masking information. Masking information is generated based on the masking hint 121 to prevent the verification apparatus 400 from comparing simulation results related to the detected invalid operation among the simulation results of the simulators 310 and 320.

The verification apparatus 400 verifies input and output operands for each cycle to thereby detect errors. However, in some operations, an amount of input operands differs from an amount of output operands. In this case, in an example, the verification apparatus 400 generates a masking bit for a specific operation to omit comparison of input and output operands. For example, if the verification apparatus 400 sets a masking bit for an operation for which comparison is to be omitted to "1", no comparison for the operation is performed.

As such, the verification apparatus 400 receives the masking hint 121 from the verification supporting apparatus 100, and generates masking information based on the masking hint 121 to prevent comparison of an invalid operation. That is, by setting a masking bit for the corresponding invalid operation to "1" for each cycle when the prologue or epilogue of a loop is executed, comparison of the invalid operation among the simulation results of the simulators 310 and 320 is prevented.

Figure 4:
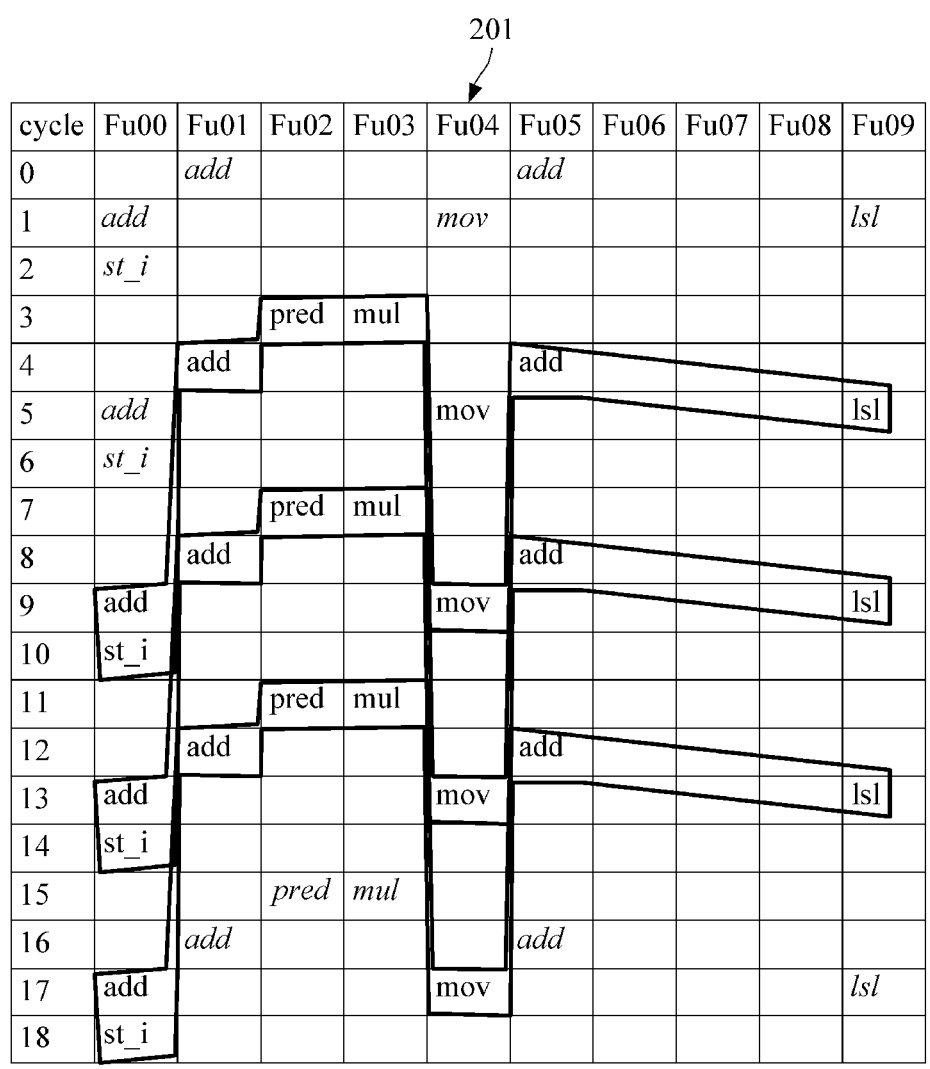
FIG. 4 is a diagram illustrating and example of a scheduling result in which the example code of FIG. 3 is mapped to the CGA.

FIG. 3 is a diagram illustrating an example of code written in C language, which is to be mapped to a Coarse-Grained Array (CGA), FIG. 4 is a diagram illustrating and example of a scheduling result 201 in which the example code of FIG. 3 is mapped to the CGA, and FIG. 5 is a diagram illustrating an example of a masking hint 121 based on the scheduling result 201 of FIG. 4.

Referring to the example illustrated in FIG. 3, the code is a source code configured to multiply an integer i by 10 while increasing the integer i by 1 from 0 to N−1, add the result of (current i value)×10 to the result of (previous i value)×10, and store the added results in memory. The source code is a loop that iterates the process N times. The scheduling result 201 obtained when the compiler 200 (see FIG. 1) modulo-schedules the example code with respect to a CGA processor is shown in FIG. 4.

Referring to the example illustrated in FIG. 4, the CGA processor includes 10 FUs Fu00 through Fu09. In this example, the compiler 200 maps the source code to the individual FUs Fu00 through Fu09 of the CGA processor through modulo-scheduling. In FIG. 4, cycles 0 through 6 correspond to a prologue, cycles 7 through 14 correspond to a loop body, and cycles 15 through 18 correspond to an epilogue.

In the scheduling result 201 shown in FIG. 4, operations written in italic type in the prologue (the cycles 0 through 6) and epilogue (the cycles 15 through 18) are invalid operations. That is, 9 operations in the prologue and 5 operations in the epilogue are invalid operations.

The invalid operation determiner 110 receives the scheduling result 201 from the compiler 200 and detects any invalid operation from the scheduling result 201. That is, the invalid operation determiner 110 checks cycle numbers of invalid operations (written in italic type) and identifications (IDs) of FUs to which the invalid operations are mapped, for each cycle of the prologue and epilogue, from the scheduling result 201.

Then, in an example, the masking hint generator 120 creates information about the invalid operations in the form of a file or table to thereby generate a masking hint 121.

FIG. 5 shows an example of the masking hint 121 generated by the masking hint generator 120 based on the scheduling result 201 of FIG. 4. Referring to the example illustrated in FIG. 5, the masking hint 121 includes information about the numbers of cycles in which the verification apparatus 400 generates masking information and IDs of FUs to which invalid operations are mapped. In the current example, the masking hint 121 is to mask 9 operations of a prologue and 5 operations of an epilogue.

The verification apparatus 400 receives the masking hint 121 and sets masking bits for the corresponding invalid operations to "1" to thereby generate masking information. For example, the verification apparatus 400 sets a masking bit for the operation "add" mapped to the first FU (that is, Fu01) in the prologue cycle 0 to "1". In this case, since the function simulator 310 (see FIG. 1) does not execute the operation "add" while the RTL simulator 320 executes it, the simulation results of the simulators 310 and 320 are different. However, the verification apparatus 400 does not compare the simulation results of the simulators 310 and 320 because the masking bit for the operation "add" has been set to "1".

Figure 6:
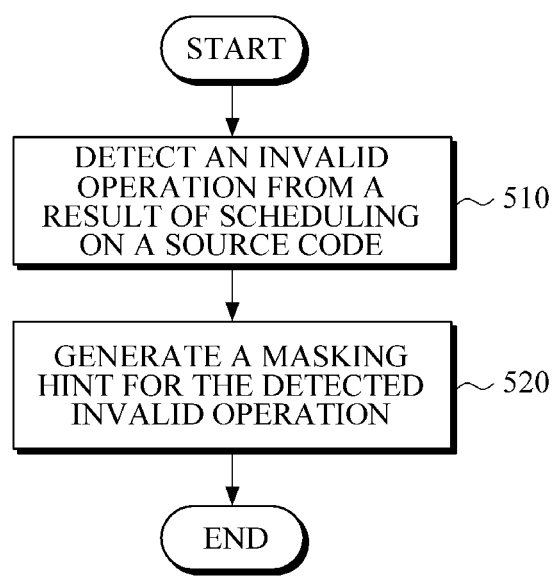
FIG. 6 is a flowchart illustrating an example of a verification supporting method.

FIG. 6 is a flowchart illustrating an example of a verification supporting method.

Referring to the examples illustrated in FIGS. 1 and 6, the invalid operation determiner 110 detects (510) an invalid operation from a result 201 of scheduling by the compiler 200. That is, in an example, the invalid operation determiner 110 receives the scheduling result 201 from the compiler 200, and detects an invalid operation that is not executed among operations mapped to the prologue and epilogue of a loop, for each cycle, based on the scheduling result 201.

Further, the masking hint generator 120 generates (520) a masking hint 121 for the invalid operation detected by the invalid operation determiner 110. In an example, the masking hint 121 contains information about the numbers of cycles for which corresponding invalid operations are included in the prologue and epilogue of the loop, and IDs of FUs to which the invalid operations are mapped. In addition, masking information is generated based on the masking hint 121 to prevent the verification apparatus 400 from comparing the simulation results related to the invalid operations among the simulation results of the simulators 310 and 320.

In an example, the verification apparatus 400 receives a masking hint 121 as shown in FIG. 5 from the verification supporting apparatus 100. Then, the verification apparatus 400, based on the masking hint 121, generates masking information related to the invalid operations for which simulation results will not be compared to each other. The verification apparatus 400 determines whether to compare the simulation results of the corresponding invalid operations based on the masking information. The verification apparatus 400 generates masking bits for the invalid operations based on the masking information to set execution or non-execution of the comparison.

For example, if a masking bit is set to "0", the verification apparatus 400 compares the simulation results of the corresponding operation. If a masking bit is set to "1", the verification apparatus 400 does not compare the simulation results of the corresponding operation. As such, in an example, the verification apparatus 400 sets masking bits for invalid operations written in a file of the masking hint 121 to "1" for each cycle when the prologue or epilogue of a loop is executed based on a masking hint 121. Then, the verification apparatus 400 does not compare the simulation results of the simulators 310 and 320 for the invalid operations.

According to the examples described above, verification is omitted for invalid operations without having to change the design of the function simulator 310 or RTL simulator 320.

The units described herein may be implemented using software components and hardware components, such as, for example, microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software components may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. For example, the software and data may be stored by computer readable recording media. Computer readable recording media may include any data storage device that can store data which can be thereafter read by a computer system or processing device. Examples of computer readable recording media include read-only memory (ROM), random-access memory (RAM), CD-ROMs, magnetic tapes, floppy disks, optical data storage devices. In addition, functional programs, codes, and code segments that accomplish the examples disclosed herein can be easily construed by programmers skilled in the art to which the examples pertain based on and using the flow diagrams and block diagrams of the figures and their corresponding descriptions as provided herein.

Program instructions to perform a method described herein, or one or more operations thereof, may be recorded, stored, or fixed in computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as that which is produced by a compiler, and files containing higher-level code that may be executed by the computer using an interpreter. The program instructions, that is, software, may be distributed over network coupled computer systems so that the software is stored and executed in a distributed fashion. For example, the software and data may be stored by computer readable storage media.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A verification supporting method of a reconfigurable processor, the method comprising:
   detecting an invalid operation from a result of scheduling on a source code; and
   generating a masking hint for the detected invalid operation,
   wherein the masking hint comprises information about a number of a cycle in a prologue or epilogue of a loop in which the detected invalid operation exists and an identification (ID) of a function unit (FU) to which the detected invalid operation is mapped.

2. The verification supporting method of claim 1, wherein the reconfigurable processor comprises a Coarse-Grained Array (CGA)-based processor.

3. The verification supporting method of claim 1, wherein the detected invalid operation comprises one of operations mapped to the prologue or epilogue of the loop according to modulo-scheduling of a compiler.

4. The verification supporting method of claim 1, wherein the detected invalid operation is not executed in a function simulator while being executed in a Register Transfer Level (RTL) simulator.

5. The verification supporting method of claim 4, further comprising:
   generating masking information based on the masking hint to prevent comparison of simulation results related to the detected invalid operation among simulation results of the function simulator and the RTL simulator.

6. A verification supporting apparatus of a reconfigurable processor, the apparatus comprising:
   an invalid operation determiner configured to detect an invalid operation from a result of scheduling on a source code; and
   a masking hint generator stored in a memory configured to generate a masking hint for the detected invalid operation,
   wherein the masking hint comprises information about a number of a cycle in a prologue or epilogue of a loop in which the detected invalid operation exists and an identification (ID) of a function unit (FU) to which the detected invalid operation is mapped.

7. The verification supporting apparatus of claim 6, wherein the reconfigurable processor comprises a Coarse-Grained Array (CGA)-based processor.

8. The verification supporting apparatus of claim 6, wherein the detected invalid operation comprises one of operations mapped to the prologue or epilogue of the loop according to modulo-scheduling of a compiler.

9. The verification supporting apparatus of claim 6, wherein the detected invalid operation is not executed in a function simulator while being executed in a Register Transfer Level (RTL) simulator.

10. The verification supporting apparatus of claim 9, wherein the masking hint is used to generate masking information to prevent comparison of simulation results related to the detected invalid operation among simulation results of the function simulator and the RTL simulator.

11. A hardware reconfigurable processor, comprising:
    a verification supporting apparatus comprising an invalid operation determiner and a masking hint generator, the invalid operation determiner being configured to detect an invalid operation from a result of scheduling on a source code, the masking hint generator being configured to generate a masking hint for the detected invalid operation; and
    a verification apparatus configured to compare simulation results of a function simulator to simulation results of a Register Transfer Level to determine if an error has been generated, and generate masking information based on the masking hint to prevent comparison of simulation results related to the detected invalid operation among the simulation results of the function simulator,
    wherein the masking hint comprises information about a number of a cycle in the prologue or epilogue of the loop in which the detected invalid operation exists and an identification (ID) of a function unit (FU) to which the detected invalid operation is mapped.

12. The reconfigurable processor of claim 11, wherein the detected invalid operation comprises one of operations mapped to the prologue or epilogue of the loop according to modulo-scheduling of a compiler.

13. The reconfigurable processor of claim 11, wherein the detected invalid operation is executed in the function simulator.

14. The reconfigurable processor of claim 11, wherein the masking information comprises a masking bit configured to indicate whether the comparing of the simulation results of the function simulator to the simulation results of the RTL simulator is to be executed.

* * * * *